(12) United States Patent
Vicktorius et al.

(10) Patent No.: US 10,081,449 B2
(45) Date of Patent: Sep. 25, 2018

(54) DEVICE FOR THE LABELING OF INDIVIDUAL PRODUCTS

(71) Applicant: Espera-Werke GmbH, Duisburg (DE)

(72) Inventors: Winfried Vicktorius, Duisburg (DE); Ulrich Jung, Dortmund (DE)

(73) Assignee: ESPERA-WERKE GmbH, Duisburg (DE)

( * ) Notice: Subject to any disclaimer, the term of this patent is extended or adjusted under 35 U.S.C. 154(b) by 0 days.

(21) Appl. No.: 15/555,206

(22) PCT Filed: Feb. 15, 2016

(86) PCT No.: PCT/EP2016/053144
§ 371 (c)(1),
(2) Date: Sep. 1, 2017

(87) PCT Pub. No.: WO2016/177486
PCT Pub. Date: Nov. 10, 2016

(65) Prior Publication Data
US 2018/0050835 A1    Feb. 22, 2018

(30) Foreign Application Priority Data

May 4, 2015   (DE) ........................ 10 2015 106 861

(51) Int. Cl.
*B65C 9/28*   (2006.01)
*B32B 37/10*  (2006.01)
(Continued)

(52) U.S. Cl.
CPC .............. *B65C 9/28* (2013.01); *B26D 7/1863* (2013.01); *B32B 37/1018* (2013.01);
(Continued)

(58) Field of Classification Search
CPC ... B65C 9/28; B32B 37/1018; B32B 37/1009; B29C 66/8262; B29C 66/828; B29C 43/22; H01L 21/6838; B26D 7/1863
(Continued)

(56) References Cited

U.S. PATENT DOCUMENTS 3,888,725 A      6/1975  French
4,526,648 A  *   7/1985  Tochtermann ............ B65C 9/28
                                                    156/497
(Continued)

FOREIGN PATENT DOCUMENTS

DE    102010040009 A1   3/2012
DE    102011012919 A1   9/2012
(Continued)

OTHER PUBLICATIONS

English translation of Written Opinion of WO2016177486.*
(Continued)

*Primary Examiner* — Sonya M Sengupta
(74) *Attorney, Agent, or Firm* — Rankin, Hill & Clark LLP (57) ABSTRACT

The present invention relates to a device (11) for the labelling of individual products (2), in particular packages or goods, with a feed device (3) for transporting a respective product (2) along a transport path, with a label dispensing device (4) for providing a label (5), and with a label application device (6) with a blowing head (7) for applying the label (5) to the surface of the product (2), wherein the blowing head (7) has a blowing head housing (8) with a pressure chamber (9), wherein the blowing head housing (8) has a housing part (10) with a plurality of housing openings (11) on the side facing towards the feed device (3), which connect the interior of the pressure chamber (9) to the
(Continued)

environment of the blowing head housing (8), and through which a compressed air pulse directed in a blow-off direction (A) from the housing openings (11) towards the feed device (3) can escape, wherein the pressure chamber (9) has a compressed air connection (12) for the introduction of compressed air into the pressure chamber (9), and wherein the label application device (6) has at least one sliding element (13, 14, 15) that can be moved between a first position in which the sliding element (13, 14, 15) can block at least some of the housing openings (11) completely, and a second position, in which the sliding element (13, 14, 15) can unblock a plurality of these housing openings at least partially. In order to simplify the structure of such a device (1), the invention proposes that holes (16, 17, 18) are provided in the at least one sliding element (13, 14, 15), which are arranged such that in the second position of the sliding element (13, 14, 15) they can be brought into at least a partial overlap with the housing openings (11) that can be blocked by the sliding element (13, 14, 15) in the first position, and that in the first position of the sliding element (13, 14, 15) they are offset relative to these housing openings (11), such that no overlap is provided. The invention furthermore relates to a method for the labelling of individual products (2).

23 Claims, 8 Drawing Sheets (51) Int. Cl.
*B26D 7/18* (2006.01)
*B29C 43/22* (2006.01)
*H01L 21/683* (2006.01)
*B29C 65/00* (2006.01)

(52) U.S. Cl.
CPC ............ *B29C 43/22* (2013.01); *B29C 66/828* (2013.01); *B29C 66/8262* (2013.01); *H01L 21/6838* (2013.01)

(58) Field of Classification Search
USPC ....... 156/285, 707, 361, 362, 303, 464, 758, 156/DIG. 31, DIG. 45, DIG. 28
See application file for complete search history.

(56) References Cited

U.S. PATENT DOCUMENTS

| | | | | |
|---|---|---|---|---|
| 4,581,094 A * | 4/1986 | Sato | ..................... | B65C 9/1876 156/352 |
| 5,971,051 A | 10/1999 | Crankshaw | | |
| 6,024,149 A * | 2/2000 | Bernhard | ................... | B65C 9/28 156/497 |
| 8,020,598 B2 * | 9/2011 | Kirita | .................... | B65C 9/0015 156/360 |
| 8,596,325 B2 * | 12/2013 | Bernhard | ................... | B65C 9/28 156/497 |
| 2014/0014264 A1* | 1/2014 | Bixen | ..................... | B65C 9/28 156/285 |

FOREIGN PATENT DOCUMENTS

| | | |
|---|---|---|
| EP | 3407837 A1 | 9/1984 |
| JP | S53112099 A | 9/1978 |
| JP | S53112100 A | 9/1978 |
| JP | 2004237988 A | 8/2004 |
| JP | 2008074422 A | 4/2008 |
| JP | 2012012069 A | 1/2012 |

OTHER PUBLICATIONS

English translation of DE102011012919.*
English translation of JP2004237988.*
English translation of JP2013152277.*
English translation of JP2008074422.*
English translation of JP53112100.*

* cited by examiner

DEVICE FOR THE LABELING OF INDIVIDUAL PRODUCTS

The present invention relates to a device for the labelling of individual products, in particular packages or goods, with a feed device for transporting a respective product along a transport path, with a label dispensing device for providing a label and with a label application device with a blowing head for applying the label to the surface of the product, wherein the blowing head has a blowing head housing with a pressure chamber, wherein the blowing head housing has a housing part with a plurality of housing openings on the side facing the feed device, which connect the interior of the pressure chamber to the environment of the blowing head housing and through which a compressed air pulse directed in a blow-off direction from the housing openings towards the feed device can escape, wherein the pressure chamber has a compressed air connection for the introduction of compressed air into the pressure chamber, and wherein the label application device has at least one sliding element that can be moved between a first position in which the sliding element can block at least some of the housing openings completely, and a second position, in which the sliding element can unblock at least partially a plurality of these housing openings.

The invention furthermore relates to a method for labelling individual products, in particular packages or goods, in which a product is transported with a feed device along a transport path, in which the product on the transport path is led past a blowing head of a label application device, in which labels are provided in a label dispensing device, in which one of the labels is transported by the label dispensing device into a blow-off position between the blowing head and the feed device, in which an overpressure is built up in a pressure chamber of the blowing head, and in which the label is transferred from the blow-off position to the product by means of a compressed air pulse directed in a blow-off direction from the blow-off position to the feed device, as soon as the product is located in front of the blow-off position in the blow-off direction.

A device and a method of the type cited in the introduction are of known art, for example, from EP 0 883 549 B1, DE 10 2010 040 009 A1 and DE 10 2011 012 919 A1. Here, packages are fed via a feed device, which is not specified in detail, to a label application device, which has a blowing head for the application of a label to the upper side of the respective package by a blow-off action. For this purpose, the package is arranged vertically below the blowing head, that is to say, vertically below a section of the blowing head with a multiplicity of housing openings, which serve both to suck on and blow off the respective label. A label adhering to the lower housing part of the blowing head in a blow-off position is blown off, as soon as the package is located below the label, by means of a compressed air pulse escaping from the housing openings and directed towards the feed device, or more particularly, the package, and by this means is transferred to the package. In terms of the invention, a position is defined as a blow-off position, in which the label to be transferred to the product is in contact with the blowing head, and is arranged in the region of action of those of the housing openings through which the compressed air pulse escapes/is outputted. This position can differ for different sized labels.

The device of known art has a label dispensing device, into which a printing device for printing the labels is integrated. The printed labels are here provided at the outlet of a label dispensing device. The respectively provided label overlaps with the lower side of the blowing head and is sucked on there, whereby the label is transferred from the label dispensing device to the label application device.

In the prior art cited, the label is held in the blow-off position in the region of the housing openings by generating a suction pressure, or a suction air flow, through the housing openings. One and the same openings serve at the same time as suck-on openings and blow-off openings. In order to generate the suction force, which in the region of the openings sucks (presses) the label onto the lower side of the blowing head housing, a vacuum generation unit is arranged inside the blowing head, which is in fluid communication with the openings for the suction process. In order to blow off the label in the direction of the package, an overpressure generation unit is arranged in the blowing head, which can be brought into fluid communication for a short time via a valve arrangement with the same openings that have previously built up the suction pressure, in order to generate the compressed air pulse that transfers the label to the package.

The valve arrangement in the blowing head is of a relatively complex design. Thus, on the one hand, a three-way solenoid valve and, on the other hand, a pot membrane that can be moved back and forth in a membrane chamber and is variable in shape, are provided in order to produce an overpressure in a pressure chamber, and to discharge/unblock the latter for the compressed air pulse. The pressure chamber is first filled by unblocking the compressed air connection from the three-way solenoid valve, such that compressed air (air at a pressure higher than atmospheric pressure or ambient pressure) flows from the compressed air connection through the three-way solenoid valve, and then flows through the membrane chamber past the pot membrane into the pressure chamber. When the compressed air flows into the pressure chamber, the pot membrane is pressed tightly against the inlet of an injection bore, which is in constant fluid communication with a separate distribution chamber, which in turn is in constant fluid communication with the housing openings. As soon as the pressure chamber is sufficiently filled, the three-way solenoid valve is switched into a position in which the compressed air connection is closed and, at the same time, a venting channel, which is in fluid communication with the membrane chamber, is unblocked. The side of the membrane chamber, from which the compressed air has previously been introduced and led past the pot membrane into the pressure chamber, is thus suddenly vented, causing the overpressure in the pressure chamber to deform the pot membrane, such that it presses against the exterior of the membrane chamber, which in turn leads to the pot membrane in the membrane chamber being moved away from its previous position. As a result, the inlet of the injection bore is suddenly unblocked, whereby the compressed air is released from the pressure chamber via the injection bore into the distribution chamber and from there through the housing openings. The compressed air pulse thereby generated from the pressure chamber through the injection bore, onward through the distribution chamber and finally through the housing openings, then transports the label onto the product, as stated.

For as accurate a positioning of the labels as possible, it is important to enable the compressed air pulse to act as far as possible on the centre of the label. This ensures that the compressed air pulse achieves a symmetrical force distribution over the label surface. Here, as in the above-described prior art, it must be taken into consideration that labels of different sizes can be provided for different requirements, all of which are moved by the label dispensing device into the blow-off position defined for the label. Here, the compressed air pulse should ideally act as far as possible in the centre of the label for each label size. In the above-described prior art, the section with housing openings is adapted to different label sizes in the direction from the label dispensing device to the blow-off position by means of a manually adjustable sliding element, which can be moved horizontally in the direction from the label dispensing device to the blow-off position, or counter to this direction, whereby a plurality of the housing openings can be individually blocked or unblocked. In this manner, an adaptation to different label lengths can be achieved.

For an adaptation to different label widths, the entire blowing head, and thus the section with the housing openings, can be moved relative to the label dispensing device transversely to the direction that runs from the label dispensing device to the blow-off position. The latter is also achieved manually.

One disadvantage in the above-described prior art is that an operator must adjust the blowing head, or more particularly, the housing openings necessary for the compressed air pulse, individually and with high accuracy for each different label size. This is very labour intensive, in particular because of the manual adjustability.

Overall, the device known from the prior art for the labelling of individual products is therefore very complex in construction and relatively labour intensive in its manipulation.

From this starting point, it is an object of the present invention to create a device and a method for the labelling of individual products, in particular packages or goods, which is simpler in construction.

In accordance with a first teaching of the present invention, the above derived and demonstrated object is achieved by a device for the labelling of individual products, in particular packages or goods, with a feed device for transporting a respective product along a transport path (the path taken by the product during transport), with a label dispensing device for the provision of a label, and with a label application device with a blowing head for the application of the label to the surface of the product (facing towards the blowing head), wherein the blowing head has a blowing head housing with a pressure chamber, wherein the blowing head housing on the side facing towards the feed device (lower side) has a housing part with a multiplicity of housing openings, which connect the interior of the pressure chamber with the environment (exterior) of the blowing head housing, and through which a compressed air pulse can escape (from the pressure chamber), directed in a blow-off direction from the housing openings to the feed device, or more particularly, the surface of the transported product, wherein the pressure chamber has a compressed air connection for purposes of introducing compressed air into the pressure chamber (from an overpressure generation unit), and wherein the label application device has at least one sliding element, which can be moved between a first position in which the sliding element can block completely or is blocking completely, at least some of the housing openings, preferably all the of housing openings, (that is to say, it can interrupt or is interrupting the fluid communication between the pressure chamber and the blowing head environment), and a second position, in which the sliding element can unblock or is unblocking some, preferably all, of the said (blocked) housing openings at least partially (that is to say, it can unblock, or is unblocking, the fluid communication between the pressure chamber and the blowing head environment) in that holes are provided in the at least one sliding element, which are arranged such that in the second position of the sliding element they can be brought into overlap at least partially (with respect to the direction of the central axis of the housing openings) with the housing openings, which in the first position can be blocked, or are blocked, by the sliding element (that is to say, through which no fluid communication then exists between the pressure chamber and the blowing head environment), and that in the first position of the sliding element, they are offset relative to these housing openings (that is to say, the housing openings that can be completely blocked in the first position) such that no overlap is provided (with respect to the direction of the central axis of the housing openings).

The term "sliding element" (or "slidable element" as used in the claims) means a component that can be displaced (moved) by a translatory and/or rotational movement between the positions cited. In particular, it takes the form of a plate of constant thickness. Individual sliding elements, or all of the sliding elements, described in what follows, can be designed and/or moveable in this manner.

When the term "blockable housing openings" is used, it means that in the state in which they are blocked by the sliding element there is no fluid communication between the pressure chamber and the blowing head environment through these housing openings, that is to say, when there is a higher air pressure in the pressure chamber than in the environment, no air can escape from the pressure chamber through these housing openings.

When the term "first position of the sliding element" is used, it is preferably an end position that is meant. When the term "second position of the sliding element" is used, it is preferably, but not necessarily, also an end position that is meant; the second position can also take the form of an intermediate position, in particular one of a plurality of intermediate positions between the first end position and another end position.

When, in accordance with the invention, one or more sliding elements are provided as part of the blowing head, or as part of the label application device, in particular in the interior of the pressure chamber, the housing openings, which serve to provide a sucking-on or a blowing-off function, can be provided directly in a housing part bounding the pressure chamber. Here a sliding element with holes, as described above, can be provided in order to unblock the fluid communication to the housing openings for the compressed air pulse, or to block it so as to build up an overpressure in the pressure chamber. In this manner, the pressure chamber can constantly be connected to the overpressure generation unit, that is to say, compressed air can be continuously introduced into the pressure chamber via the compressed air connection, without the need for a separate valve to interrupt the compressed air supply into the pressure chamber. Optionally, such a valve can nevertheless be provided. Moreover, no complicated arrangement of a label application device with a membrane chamber with an inset pot membrane, an additional injection bore and an additional distribution chamber, is required in order to release the compressed air from the pressure chamber suddenly for the compressed air pulse.

A sliding element as defined above can alternatively or additionally also be used for adapting the label application device to labels of different sizes. As will be described further below, one or two sliding elements can be used to unblock an individual region of housing openings for the compressed air pulse, which is then optimised in each case for one of a plurality of different label lengths and/or widths. In this manner, the centre of the compressed air pulse, or the centre of the region with the (unblocked) housing openings provided for purposes of generating the respective compressed air pulse (through which openings, in the case of a compressed air pulse, air is not sucked in, but blown out), is always exactly aligned with labels of different lengths and/or widths. By the term "unblocking of an individual region of housing openings" is meant that, if these housing openings are not otherwise blocked (for example by another sliding element), air can escape from the pressure chamber into the environment.

In what follows, further embodiments of the inventive device are described.

Thus, in accordance with one configuration, provision is made for the label application device to have at least two, preferably at least three, sliding elements, which can be moved between a first position, in which the respective sliding element can block, or is blocking, at least some of the housing openings completely, and a second position, in which the respective sliding element can unblock, or unblocks, these housing openings at least partially, wherein holes are provided in each sliding element, which are arranged such that in the second position of the respective sliding element they can be brought into at least a partial overlap with the housing openings that can be blocked by the sliding element in the first position, and in the first position of the respective sliding element they are offset relative to these housing openings, such that no overlap is provided. The inventive device thus preferably has at least one sliding element, designed as a closure slide, that is to say, a sliding element that completely blocks the housing openings if an overpressure is to be built up in the pressure chamber, and unblocks the housing openings at least partially, preferably completely, in order to generate the compressed air pulse. At the same time, the inventive device preferably has at least one, preferably two, sliding elements, designed as a label size adaptor mask, that is to say, sliding elements with which a certain region of the housing openings can be unblocked for the compressed air pulse, and another corresponding region can be blocked, in order to achieve an alignment of the compressed air pulse as far as possible with the centre of the label, even in the case of different label lengths and/or widths. In the case of each of the sliding elements provided in accordance with the invention, both in the case of the closure slide and also in the case of the label size adaptor masks, the holes always connect the side of the respective sliding element that faces towards the feed device with the side of the respective sliding element that faces away from the feed device, that is to say, the openings have a central axis that intersects the side facing towards the feed device and the side of the slide element that faces away from the feed device, and in particular runs perpendicular thereto.

In accordance with a further embodiment of the inventive device, at least one sliding element, preferably all sliding elements, is or are arranged in the interior of the pressure chamber. In principle, however, it is also conceivable to provide at least the closure slide, which unblocks all the openings for the compressed air pulse, and otherwise blocks them, on the exterior (lower side) of the housing part with the housing openings.

In accordance with another embodiment, at least one sliding element, preferably all sliding elements, is or are in each case connected to a drive (effecting the movement). The respective drive, which in particular is connected to a control device, moves the respective sliding element between the first and the second position.

In accordance with a further embodiment of the inventive device, at least one sliding element, preferably all sliding elements, is or are designed in the form of a plate (that is to say, a so-called slider plate). Such a slider plate can be made of metal, and in particular has a thickness in a range from 0.5 to 5 mm, preferably in a range from 1 to 3 mm, particularly preferably in a range from 1 to 2 mm. The respective sliding element, in particular the plate-form sliding element, can also be coated, for example, in order to optimise sealing, and/or to achieve particularly good sliding properties during movement.

Again in accordance with a further embodiment, provision can be made for at least one sliding element, preferably all sliding elements, to be moveable between the respective first position and second position at an angle, in particular at right angles, to the blow-off direction.

In what follows, various embodiments of an inventive device with a closure slide are described.

Thus, as stated, provision can be made for at least one sliding element to form a closure slide. This can be positioned and/or its holes are arranged, such that in the first position it completely blocks all the housing openings, and in the second position unblocks a plurality of, preferably all, housing openings at least partially, preferably completely.

In accordance with one embodiment, the closure slide fits against the housing part with the housing openings in a sealing manner, in particular on the side of the housing part facing away from the feed device, whereby in the first position it closes/covers all the housing openings directly. The closure slide can preferably be moved parallel to the housing part, in particular at right angles to the central axis of the housing openings.

Furthermore, at least one stationary perforated plate with perforated plate openings can be arranged in the pressure chamber, wherein the number of perforated plate openings corresponds in particular to the number of housing openings, and the perforated plate openings are (exactly) aligned with the housing openings (in the blow-off direction or in the direction of the central axis of the housing openings), wherein the perforated plate openings in particular narrow towards the housing openings (and thereby form nozzles). Here the narrowest cross-section of the perforated plate openings corresponds in particular to the cross-section of the housing openings. The closure slide is then in particular arranged between the stationary perforated plate and the housing part with the housing openings. The closure slide in particular also fits against the stationary perforated plate in a sealing manner, in particular on the side of the stationary perforated plate facing towards the feed device, and can preferably be moved parallel to the stationary perforated plate, in particular at right angles to the central axis of the perforated plate openings. Here the central axis of the perforated plate openings in particular runs coaxially with the central axis of the housing openings aligned with the latter. In that the closure slide is arranged between the perforated plate and the housing part, the sealing in the first position of the closure slide is optimised because, in this case, two sealing surfaces are provided between the pressure chamber and the exterior of the blowing head. A plurality of stationary perforated plates can also be provided, wherein one or each of the perforated plates is arranged in each case on the side of the closure slide facing away from the feed device.

In accordance with a further embodiment of the device, provision is made for the holes of the closure slide to have differing hole cross sections, that is to say differing cross-sectional shapes and/or cross-sectional areas, wherein the holes arranged in a central section (with respect to the direction of movement of the closure slide) in particular have a greater length (the dimension in the direction of movement of the closure slide), and/or a greater width (the dimension transverse to the direction of movement of the closure slide), and/or a larger cross-sectional area, than the other holes (that is to say, the holes in the other sections of the closure slide on either side of the central section).

The central section is defined as a section that extends in particular over the entire width (the dimension transverse to the direction of movement of the closure slide), and/or the entire length (the dimension in the direction of movement of the closure slide) of the closure slide. In particular, provision is then made for the central section to extend over the entire length of the closure slide, if the direction of movement of the closure slide runs parallel to the direction in which the label is dispensed (label dispensing direction), and/or is transported from the dispensing position to the blow-off position (label transport direction). Correspondingly it is conceivable for the central section then to extend over the entire width of the closure slide, if the direction of movement of the closure slide runs orthogonally, that is to say, transversely, with respect to the direction in which the label is dispensed and/or is transported.

In that holes with larger dimensions are provided in the central section, the result is that when the closure slide moves from the first position, in which all the housing openings are blocked, in the direction of the second position, those housing openings which, when the second position is reached, align with the holes of larger cross-section in the closure slide, are unblocked, earlier than the other openings. In this manner, a compressed air pulse can be generated, which slightly folds the label initially in an axial direction during the blow-off process, in order thereby to improve the flight characteristics. The compressed air pulse, or more particularly, the blowing force of the pulse acting on the label, thereby acts earlier and/or more strongly over one of the lines of symmetry of the label, than in the adjacent zones. For this purpose, it is particularly preferable if the holes in the central section have a greater width and a greater length than the holes in the other sections at the sides of the central section, and in particular are designed as elongated holes, whereas the holes in the other sections in particular are designed as circular holes. In particular, the cross-section of the other holes (that is to say, the holes in the sections adjacent to the central section) corresponds to the cross-section, preferably the cross-sectional shape and/or the cross-sectional area, of the housing openings.

In what follows, some embodiments of an inventive device with one or a plurality of label size adaptor masks will now be described.

Thus, as stated, in accordance with the invention provision can also be made for at least one sliding element to form a label size adaptor mask. This can be positioned and/or its holes are arranged such that—if the housing openings in the housing part are not otherwise blocked, for example by the closure slide—
  in the first position it at least partially, preferably completely unblocks a plurality of housing openings (that is to say, fluid connecting paths through the housing part with the housing openings), and completely blocks the other housing openings, that is to say, fluid connecting paths, and
  in the second position unblocks all housing openings, that is to say, fluid connecting paths, at least partially, preferably completely.

In this regard, it should be emphasised once again that the second position is not necessarily an end position of the closure slide, but rather can also be an intermediate position between two end positions. Thus, if the second position is not an end position, it is conceivable that the label size adaptor mask can be positioned, and/or its holes arranged, such that—if the housing openings in the housing part are not otherwise blocked, for example by the closure slide—
  in the first position it completely unblocks a plurality of housing openings and completely blocks the other housing openings,
  in the second position (an intermediate position) it partially unblocks all housing openings, or unblocks only some of the housing openings completely, and blocks the others partially or completely, and
  in a third position it completely unblocks all housing openings.

In particular two sliding elements are provided, which in each case form a label size adaptor mask, which can be positioned, and/or its holes arranged, such that—if the housing openings in the housing part are not otherwise blocked, for example by the closure slide—
  in the first position it unblocks a plurality of housing openings at least partially, preferably completely, and blocks the other housing openings completely, and
  in the second position unblocks all housing openings at least partially, preferably completely, or—if the second position is not an end position—
  in the first position it unblocks a plurality of housing openings completely and blocks the other housing openings completely,
  in the second position (intermediate position) it unblocks all housing openings partially, or unblocks only some of the housing openings completely, and blocks the others partially or completely, and
  in a third position unblocks all housing openings completely.

In accordance with one embodiment provision is made—if the housing openings are not otherwise blocked—for one of the label size adaptor masks in the first position to unblock other housing openings (that is to say, other fluid connecting paths through the housing part with the housing openings) than another label size adaptor mask. With one of the label size adaptor masks described, an adaptation of the blowing head, that is to say, of the label application device, to different label lengths can then take place, for example. With the other label size adaptor mask, an adaptation to different label widths can take place. Here it is also quite conceivable that the one label size adaptor mask and the other label size adaptor mask can be simultaneously positioned in their first position, whereby then—if the housing openings are not otherwise blocked—in particular a smaller number of housing openings, that is to say, fluid connecting paths, are unblocked than is the case in which only one or the other of the label size adaptor masks is positioned in its first position. In principle, it is also conceivable that if both label size adaptor masks are in the first position, all housing openings are blocked, and/or, if both label size label size adaptor masks are in the second position, all housing openings are unblocked.

In accordance with a further embodiment, at least one label size adaptor mask fits against the stationary perforated plate in a sealing manner, in particular on the side of the stationary perforated plate facing away from the feed device, and can preferably be moved parallel to the stationary perforated plate, in particular at right angles to the central axis of the perforated plate openings. Provision can also be made for one label size adaptor mask to fit against another label size adaptor mask in a sealing manner, in particular on the side of the other label size adaptor mask facing away from the feed device, and for it to be preferably moveable parallel to the other label size axis of the holes of the other label size adaptor mask. In the latter case, a stationary perforated plate can also be provided, against which the upper label size adaptor mask (that is to say, the one of the two masks that is furthest away from the feed device) fits in a sealing manner. In particular, provision is made for each of the label size adaptor masks and/or the label size adaptor mask that is furthest away from the feed device to fit against the stationary perforated plate in a sealing manner, wherein the label size adaptor mask fitting against the stationary perforated plate in a sealing manner in particular fits against the side of the stationary perforated plate facing towards the feed device.

The label size adaptor mask(s) can preferably be moved parallel to the closure slide that unblocks or blocks all the housing openings. In particular, both label size adaptor masks can be moved in the same direction, and in particular in the same direction as the closure slide.

Finally, in accordance with a further embodiment of the inventive device, provision is also made for it to have a product data store for the provision of product-specific information (for example, information concerning the type of product and/or the length, width and/or height of the product, etc.) and a label data store for the provision of label–specific information (for example, information concerning the type of label, in particular with regard to its application in a thermal direct printing process or a thermal transfer printing process, and/or information concerning the length and/or width of the label, and/or regarding the printing intensity, etc.), wherein in the label data store in particular the respective position of the label size adaptor mask(s) during the compressed air pulse is filed (stored) individually for different label sizes. Here the respective assignments of positions to the different label sizes are deliberately not filed in the product data store. The product data store is less suitable for this information, since the same product requires different information on another labelling device with, for example, a pneumatically actuated cylinder for applying the respective label to the product. In accordance with the invention, users using a plurality of different labelling devices can therefore use the same product database on all their labelling devices without having to make any adjustments to the latter. For this purpose, the inventive labelling device has a label data store that is independent of the product data store, and by means of which the required settings can be made automatically on the blowing head when a particular label, in particular a specific label length and/or width, is selected.

The inventive device can have an appropriate control device, which is connected to the label data store and thus automatically recognises and executes the correlation between label size and the adjustments to be made. The user does not therefore first have to file and maintain this data.

The above-derived and indicated object, furthermore in accordance with a second teaching of the present invention is achieved in a method for labelling individual products, in particular packages or goods, preferably using a device as defined above, in which a product is transported by means of a feed device along a transport path, in which the product on the transport path is led past a blowing head of a label application device, in which labels are provided in a label dispensing device, in which one of the labels is transported by the label dispensing device into a blow-off position between the blowing head and the feed device, in which an overpressure is built up in a pressure chamber of the blowing head, and in which the label is transferred from the blow-off position onto the product by means of a compressed air pulse directed in a blow-off direction from the blow-off position towards the feed device, as soon as the product is located in front of (underneath) the blow-off position in the blow-off direction, in that the compressed air pulse escapes from the pressure chamber (into the environment) through holes in at least one sliding element and through housing openings, which are at least partially in overlap, in a housing part that faces towards the feed device, and which connect the interior of the pressure chamber with the environment of the blowing head.

In accordance with one embodiment of the inventive method, the compressed air pulse is generated by moving a sliding element forming a closure slide from a first position, in which the closure slide blocks all the housing openings completely while the overpressure (in the pressure chamber) is being built up, into a second position, in which all the housing openings are unblocked at least partially, preferably completely.

In accordance with a further embodiment of the method, provision is made, before the movement of the closure slide from the first position into the second position, for at least one sliding element forming a label size adaptor mask, in particular two sliding elements, each forming a label size adaptor mask, to be moved into a position in which the respective label size adaptor mask—if the housing openings in the housing part are not otherwise blocked, for example by the closure slide—unblocks a plurality of housing openings at least partially, preferably completely, and blocks the other housing openings completely.

There are now a multiplicity of options for designing and developing the inventive device and the inventive method. Reference is made in this respect, on the one hand to the patent claims following claims 1 and 20, and on the other hand to the description of examples of embodiment in conjunction with the figures. In the figures:

Figure 1:
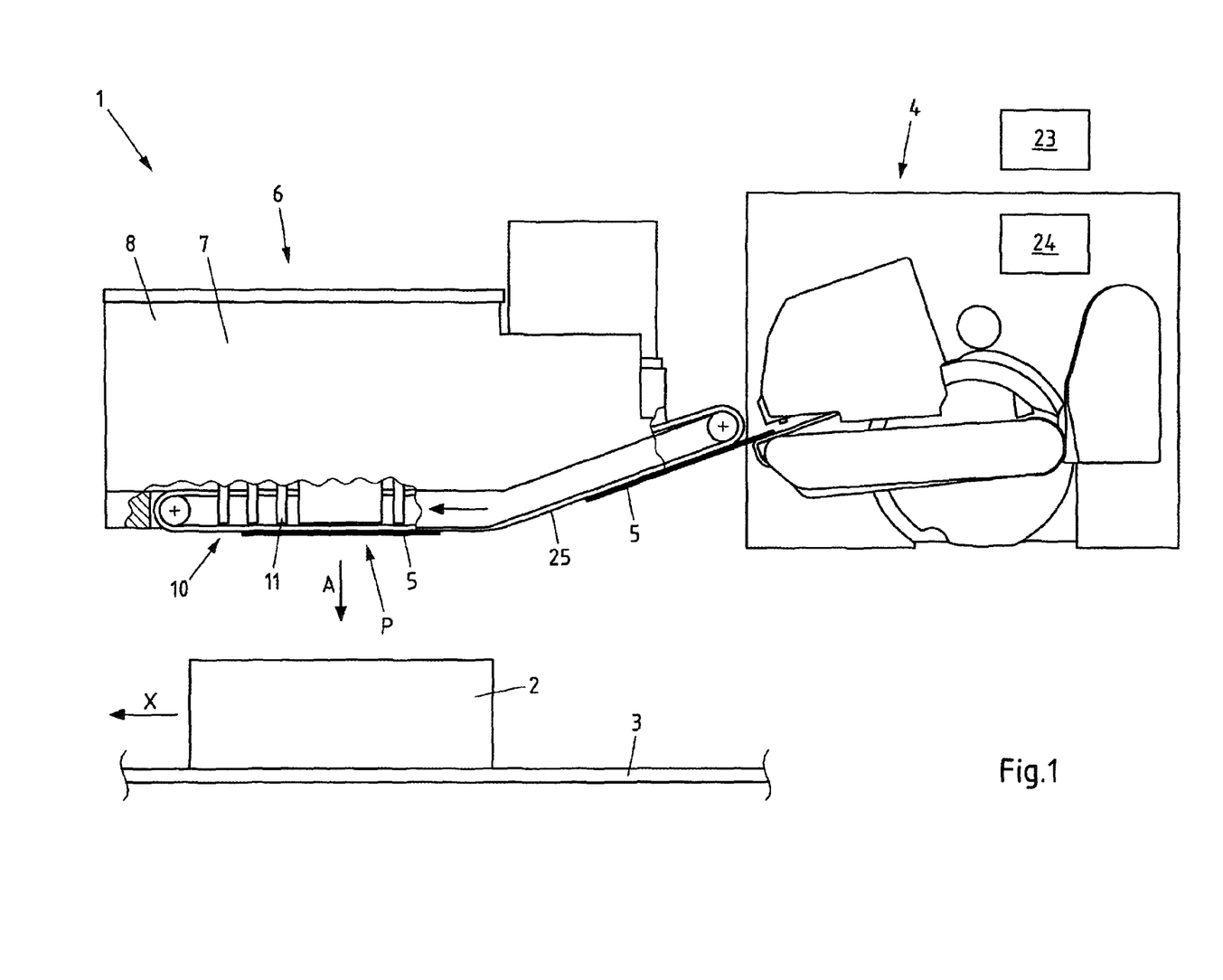
FIG. 1 shows a schematic side view of an inventive device for the labelling of individual products.

FIG. 1 illustrates a device 1 for the labelling of individual products 2, in particular packages or goods. The device 1 has a feed device 3 for transporting a respective product 2 along a transport path. Furthermore a label dispensing device 4 for the provision of labels 5, and a label application device 6 with a blowing head 7 for purposes of applying the respective label 5 onto the surface of the product 2, are components of the device 1.

During operation of the device 1, the product 2 to be labelled is transported in a direction of transport X on the feed device 3, which takes the form, for example, of a belt conveyor. During the transport of the product 2, a label 5 is detached from a carrier strip inside the label dispensing device 4 by means of the label dispensing device 4, and is subsequently supplied to the blowing head 7. The latter action is carried out in the example of embodiment shown in FIG. 1 by means of a conveyor device 25, which individually feeds each label 5 provided from the label dispensing device 4 into a position vertically below the blowing head 7, referred to as the blow-off position P. As soon as the product 2 is located vertically underneath the blow-off position P, the respective label 5 is blown off from the blow-off position P onto the product 2 in a blow-off direction A by means of a compressed air pulse generated by the blowing head 7.

Figure 2:
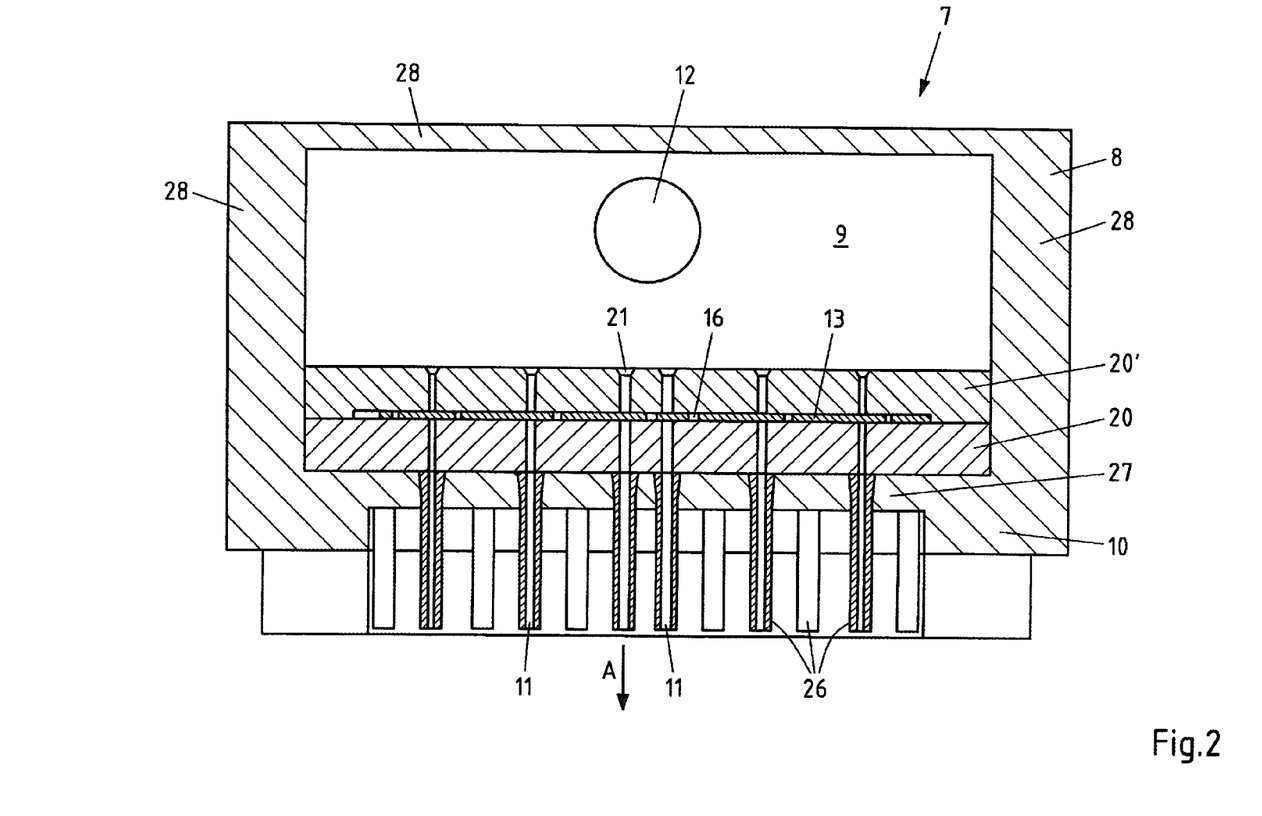
FIG. 2 shows a schematic cross-sectional view of a part of an example of embodiment of a blowing head for the device in FIG. 1.
Figure 5:
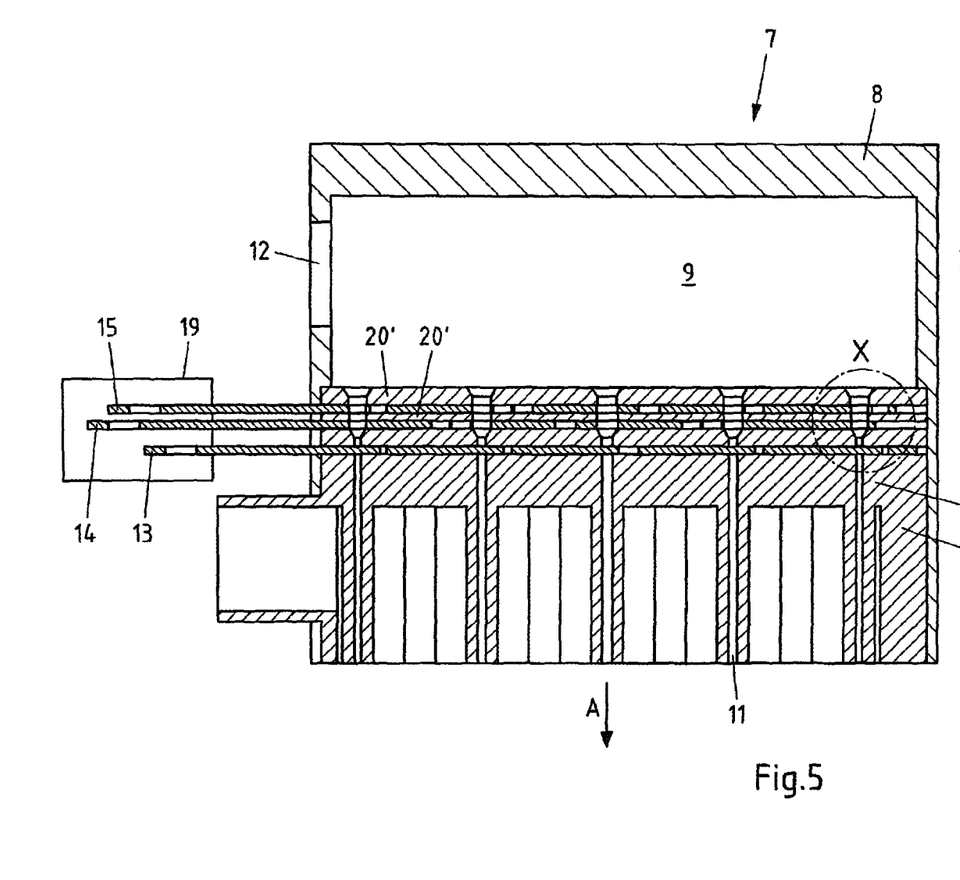
FIG. 5 shows a schematic cross-sectional view of a part of an example of embodiment of a blowing head for the device in FIG. 1, and FIGS. 6*a*)-*c*) show various positions of label size adaptor masks of a blowing head for the device in FIG. 1.

The blowing head 7, by way of which the compressed air pulse is generated and released, has a blowing head housing 8 with a pressure chamber 9 arranged therein (FIG. 2, FIG. 5). The blowing head housing 8 has a housing part 10 facing towards the feed device (3) with a plurality of housing openings 11 on the lower side, which connect the interior of the pressure chamber 9 with the environment (the region outside the blowing head housing 8). A compressed air pulse directed from the housing openings 11 towards the feed device 3 can then escape from the pressure chamber 9 through these housing openings 11 in the said blow-off direction A.

In order to be able to align the compressed air pulse optimally with respect to the centre of the label 5, two label size adaptor masks 14 and 15 are arranged in the blowing head housing 8, and in particular in the pressure chamber 9; these can be moved into different positions depending on data (label-specific information) filed in a label data store 24 for different label sizes, in order thereby to block a plurality of the housing openings 11 during the compressed air pulse, and to unblock others—if the housing openings in the housing part are not otherwise blocked, for example by the closure slide.

Independently of the label data store 24, the device 1 also has a product data store 23, with product-specific information filed therein.

The arrangement and mode of operation of the label size adaptor masks 14 and 15 will be explained in more detail below, with reference to FIGS. 5 and 6a) to 6c).

However, the mode of operation of another sliding element in the pressure chamber 9 will first be discussed. Thus, a closure slide 13 is provided, which serves to block all the housing openings 11 completely if an overpressure is being built up in the pressure chamber 9, and to unblock them completely in order to dissipate the overpressure suddenly, so as to generate the said compressed air pulse through the unblocked housing openings 11 (that is to say, those that are not blocked by the one or more label size adaptor masks). The mode of operation of the closure slide 13 will be explained in what follows with reference to the example of embodiment in FIGS. 2 to 4.

Figure 3:
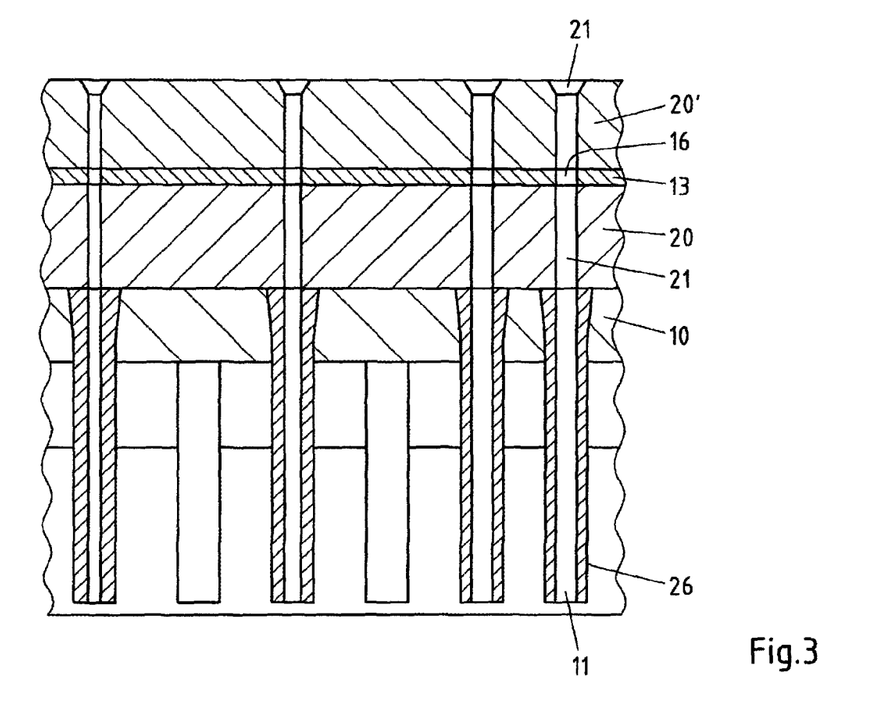
FIG. 3 shows a schematic cross-sectional view of a detail of the blowing head in FIG. 2.
Figure 4:
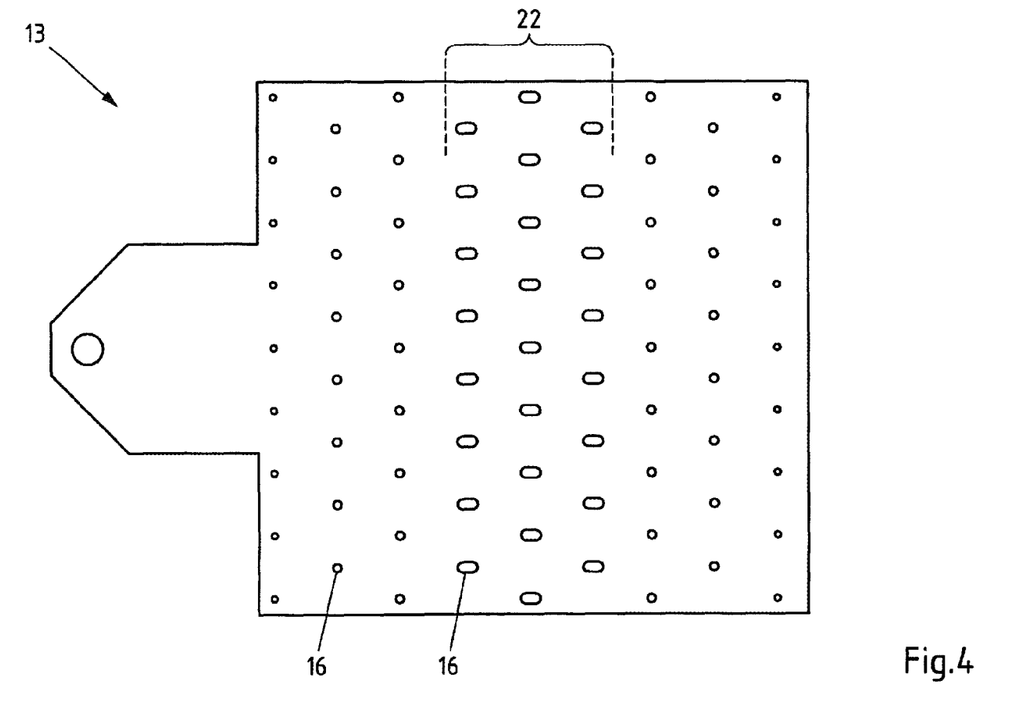
FIG. 4 shows a schematic view of a closure slide of a blowing head for an inventive device.

FIGS. 2 to 4 show only a single sliding element arranged in the pressure chamber 9, namely the closure slide 13, together with one perforated plate 20 arranged vertically underneath it, and one perforated plate 20' arranged vertically above it. As is illustrated in the further example of embodiment in FIG. 5, a first label size adaptor mask 14 can be arranged vertically above the closure slide 13, if required with a perforated plate 20' arranged vertically in between, and optionally a second label size adaptor mask 15, if required with a further perforated plate 20' arranged vertically in between, can be provided as additional sliding elements. However, these label size adaptor masks 14 and 15 are not mandatory and can be dispensed with, for example, in the case where an alignment of the blowing head with respect to differently sized labels takes place in another manner; for example by means of the conveyor device 25 illustrated as an example in FIG. 1, which transports the labels 5 in the transport direction X from the label dispensing device 4 to the blow-off position P, or in the transverse direction by the provision of a means of movement for the entire blowing head.

FIG. 2 illustrates by way of example the structure of a pressure chamber 9 for a device 1 according to FIG. 1. The pressure chamber 9 is bounded underneath by a housing part 10 of the blowing head housing 8 in which the housing openings 11 are arranged. The housing openings 11 are formed here by a plurality of hollow cylinders 26, which extend from a plate-form section 27 of the housing part 10 in the blow-off direction A. The hollow cylinders 26 are here, by way of example, designed as separate sleeves, which are mechanically connected to the housing part 10 in a sealing manner. All the other sides of the pressure chamber 9 are blocked by pressure chamber walls 28. A compressed air connection 12 for introducing compressed air into the pressure chamber 9 is provided in one of the pressure chamber walls. Here the compressed air connection 12 is only shown schematically as an opening. Through this opening air with an overpressure (a pressure higher than the ambient pressure or atmospheric pressure) enters into the pressure chamber 9.

A sliding element in the form of a closure slide 13 is located at the lower end of the pressure chamber 9, here mounted on an optional stationary perforated plate 20. This closure slide 13 is arranged in a sealing manner between the perforated plate 20, which fits against the housing part 10 with the housing openings 11, and a further perforated plate 20'. "Sealing" in the context of the invention always means gas-tight.

As shown in FIG. 4, the closure slide 13 is provided with a plurality of holes 16. In a first position of the closure slide 13 relative to the housing part 10, which is stationary relative to the other blowing head housing 8, and the likewise stationary perforated plates 20 and 20', the closure slide 13 blocks all housing openings 11 (meaning the channels running in the blow-off direction A in the housing part 10, or in the hollow cylinders 26, respectively). This state of the blowing head 7 is illustrated in FIG. 2, and serves to fill the pressure chamber 9 with compressed air.

For purposes of generating a compressed air pulse the closure slide 13 can then be moved into the second position shown in FIG. 3, in which the housing openings 11, which in the first position are still blocked by the closure slide 13, are unblocked. The pressurised air in the pressure chamber 9 can then escape suddenly through the housing openings 11 that are not blocked by one of the label size adaptor masks, and channels in the housing part 10, in the blow-off direction A. The compressed air pulse generated in this manner then conveys a label 5 located in the blow-off position P onto the surface of a product 2 that is located underneath it.

As FIG. 3 shows, each stationary perforated plate 20 or 20' has perforated plate openings 21 that are exactly aligned with the housing openings 11. When the closure slider 13 is in the second position, in which the housing openings 11 are unblocked by the closure slider, a continuous channel for the escape of the compressed air pulse is formed in each case by a perforated plate opening 21 via the respectively aligned hole 16 in the closure slider 13, and finally via the respectively aligned housing opening 11 in the housing part 10.

FIG. 4 shows an example of embodiment of a plate-form closure slide 13, as has been described above. In this example of embodiment, the holes 16, which are arranged in the central section 22 (with respect to the direction of movement of the closure slide 13), are shaped differently from the other holes 16 in the two adjacent sections. Thus, the holes 16 in the central section 22 are here designed as elongated holes, whereas the other holes 16 have a circular cross-section. Moreover, the holes 16 in the central section 22 have a greater width than the other holes 16 with the circular cross-section. As a result, when the closure slide 13 is moved from the first position into the second position, a compressed air pulse is produced which acts earlier and more strongly on the centre of the label, whereby the respective label 5 is slightly folded initially in the centre in order to improve its flight characteristics.

FIG. 5 shows an example of embodiment with the optional additional arrangement of the two label size adaptor masks 14 and 15 above the closure slide 13. The two label size adaptor masks 14 and 15 are similarly of a plate-form design, and can be moved in exactly the same way as the closure slide 13 at right angles to the blow-off direction A between a first position and a second position. Here, for example, the movement is effected by means of a drive 19, but can also be carried out manually.

If the housing openings 11 are not otherwise blocked, that is to say, if in the present case the closure slide 13 is in the second position, and therefore unblocks all the housing openings, it is achieved in each case with a label size adaptor mask that in the first position of the respective label size adaptor mask a plurality of housing openings 11 are completely unblocked, and the other housing openings 11 are completely blocked, while in the second position of this label size adaptor mask all the housing openings 11 are completely unblocked. The latter state is illustrated in FIG. 5, where both label size adaptor masks 14 and 15 are located in the second position, in which all housing openings 11 are unblocked.

In this regard it should be noted that in the examples of embodiment here described the first position and second position only illustrate end positions by way of example. In particular the second position can, however, also be an intermediate position, in particular, one of a plurality of intermediate positions between the first end position and a further end position. Thus, the case would also be conceivable, in which in the first position of the respective label size adaptor mask a plurality of housing openings 11 are completely unblocked, and the other housing openings 11 are completely blocked, in a second position of the said label size adaptor mask all housing openings 11 are only partially unblocked, or only some of the housing openings 11 are completely unblocked, and in a third position of the said label size adaptor mask all of the housing openings 11 are completely unblocked.

As in particular the detail X in FIG. 5 makes clear, with an open closure slide 13 (closure slide 13 in the second position) a channel is formed for the compressed air pulse through the holes 17 and 18 arranged in alignment with one another of the two label size adaptor masks 14 and 15, the respective perforated plate openings 21, the hole 16 in the closure slide 13, and finally the housing openings 11 of the housing part 10, whereas in the position of the closure slide 13 shown in the detail X the said channel is blocked.

Figure 6A:
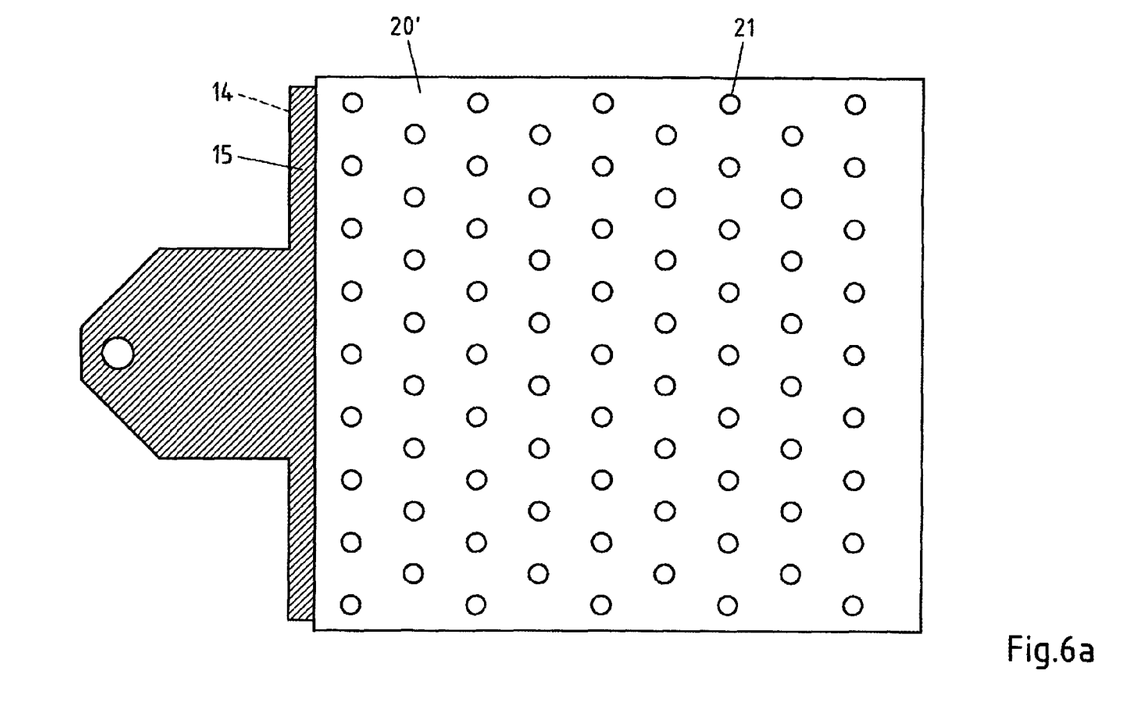

As FIGS. 6a) to 6c) illustrate, with the presence of two label size adaptor masks 14 and 15 in the first position different regions of housing openings 11 can be unblocked. The views in FIGS. 6a) to 6c) are vertically directed from above onto an optional further stationary perforated plate 20', which can be located vertically above the label size adaptor masks 14 and 15 (not shown in FIG. 5), wherein the optional stationary perforated plate 20' can have the same features as the stationary perforated plate 20.

In FIG. 6a) it can be discerned that all perforated plate openings 21 of the perforated plate 20 are unblocked, if both closure slides 14 and 15 are located in the second position. In other words, in this case all housing openings of the housing part 10 are also unblocked, if the closure slide 13 is also located in the second (open) position.

Figure 6B:
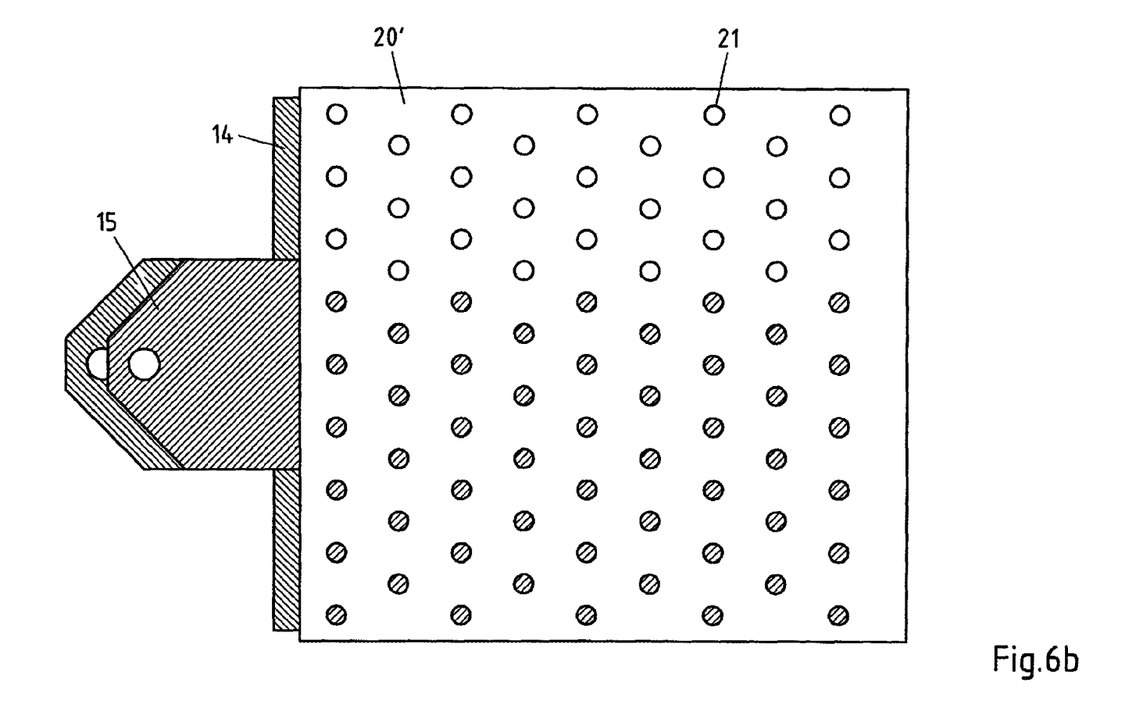

In FIG. 6b) the first label size adaptor mask 14 is located in the first position, whereas the second label size adaptor mask 15 is also in the second position, as in FIG. 6a). In this case only a proportion of the perforated plate openings 21 of the perforated plate 20 are unblocked, whereas a greater proportion of the perforated plate openings 21 are blocked. Accordingly in this case with the closure slide 13 open the housing openings 11 aligned with the unblocked perforated plate openings 21 are also unblocked, while the housing openings 11 aligned with the blocked perforated plate openings 21 are blocked.

Figure 6C:
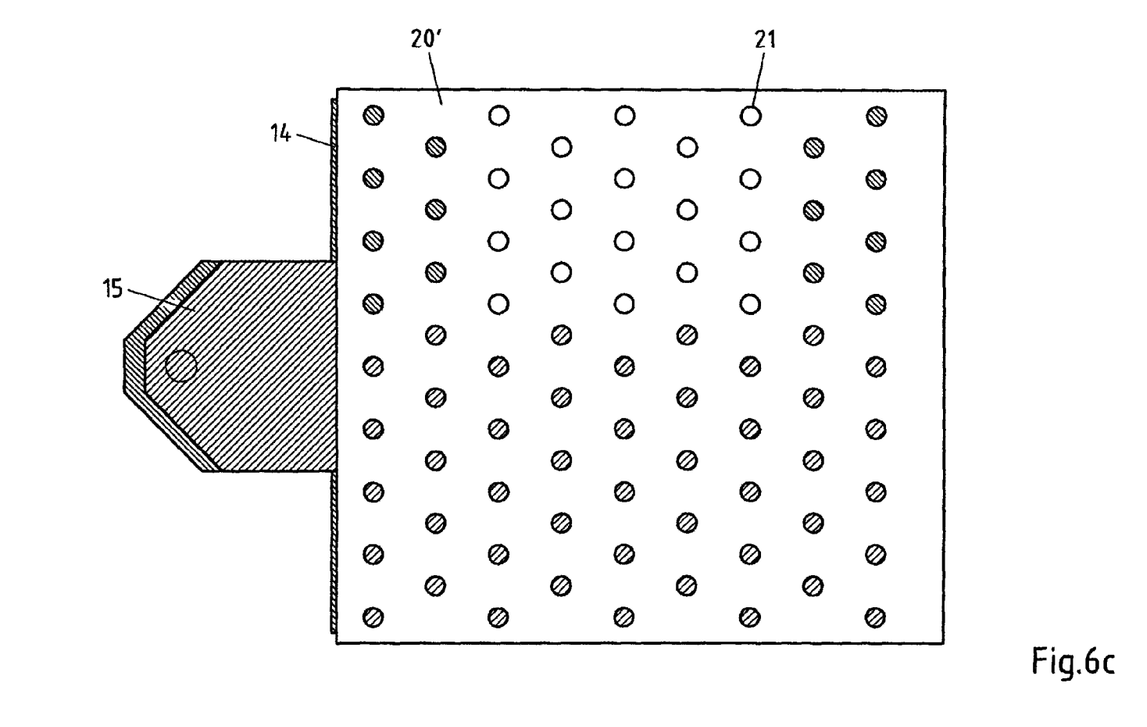

FIG. 6c) shows an arrangement of the two label size adaptor masks 14 and 15, in which both label size adaptor masks are located in the first position. In this case the region with the unblocked perforated plate openings 21 and accordingly (with the closure slide 13 open), the region with the unblocked housing openings 11 is even smaller than in the state illustrated in FIG. 6b).

As FIGS. 6a) to 6c) illustrate, by the movement of the two label size adaptor masks 14 and 15 individual regions of perforated plate openings 21 and housing openings 11 can be unblocked, through which then, if the closure slide 13 is located in the second (open) position, the compressed air pulse acts. This possibility of the formation of individual regions allows for the adaptation and alignment of the compressed air pulse relative to the label surface, such that even labels 5 with different dimensions can always be optimally captured by the compressed air pulse.

The invention claimed is:
1. A device for labelling products comprising:
a feed device for transporting individual products to be labeled along a transport path;
a label dispensing device for dispensing labels; and
a label application device for applying labels dispensed from the label dispensing device onto the individual products transported by the feed device;
wherein the label application device comprises a blowing head,
wherein the blowing head includes a blowing head housing containing a pressure chamber,
wherein the pressure chamber includes a compressed air connection for introducing compressed air into the pressure chamber,
wherein the blowing head housing includes a housing part provided with a plurality of housing openings on a side facing toward the feed device,
wherein the label application device comprises at least two slidable elements, wherein each of the at least two slidable elements is movable between a first position in which the respective slidable element blocks at least some of the plurality of housing openings completely and a second position in which the respective slidable element at least partially unblocks said at least some of the plurality of housing openings, wherein each of the at least two slidable elements is provided with holes, wherein the holes are arranged such that when each of the slidable elements are in the second position the holes at least partially overlap with the at least some of the plurality of housing openings that are blocked by the respective at least two slidable elements when said at least two slidable elements are in the first position, wherein the holes are arranged such that when each of the slidable elements are in the first position the holes are offset relative to the at least some of the plurality of housing openings, and wherein when the at least two slidable elements are in the second position and the at least some of the plurality of housing openings are at least partially unblocked compressed air in the pressure chamber air escapes from the pressure chamber through the housing openings out of the blowing head in a blow-off direction toward the feed device.

2. The device according to claim 1, wherein the label application device further comprises at least a third slidable element, wherein the third slidable element is movable between a first position in which the third slidable element blocks at least some of the housing openings completely and a second position in which the third slidable element at least partially unblocks said at least some of the housing openings.

3. The device according to claim 1, wherein at least one of the at least two slidable elements is arranged in an interior of the pressure chamber.

4. The device according to claim 1, wherein at least one of the at least two slidable elements is connected to a drive.

5. The device according to claim 1, wherein at least one of the at least two slidable elements is in a form of a plate.

6. The device according to claim 1, wherein at least one of the at least two slidable elements is movable between the first position and second position at an angle relative to the blow-off direction.

7. The device according to claim 1, wherein at least one of the at least two slidable elements forms a closure slide, which in the first position blocks all of the plurality of housing openings completely, and in the second position at least partially unblocks at least some of the housing openings.

8. The device according to claim 7, wherein the closure slide contacts the housing part provided with the housing openings in a sealing manner on a side of the housing part facing away from the feed device.

9. The device according to claim 8, wherein at least one stationary perforated plate provided with perforated plate openings is arranged in the pressure chamber, wherein the perforated plate openings correspond to the plurality of housing openings, wherein the perforated plate openings are aligned with the plurality of housing openings, and wherein the perforated plate openings narrow toward the plurality of housing openings.

10. The device according to claim 9, wherein the closure slide is arranged between the stationary perforated plate and the housing part provided with the plurality of housing openings.

11. The device according to claim 9, wherein the closure slide contacts the stationary perforated plate in a sealing manner on a side of the stationary perforated plate facing towards the feed device.

12. The device according to claim 7, wherein the holes of the closure slide have differing hole cross-sections, wherein holes arranged in a central portion of the closure slide have a greater length and/or a greater width and/or a larger cross-sectional area than other holes in other portions of the closure slide.

13. The device according to claim 12, wherein a cross-section of the other holes in the other portions of the closure slide corresponds to a cross-section of the plurality of housing openings.

14. The device according to claim 1, wherein at least one of the at least two slidable elements is a first label size adaptor mask, wherein in the first position the first label size adaptor mask completely blocks some, but not all, of the plurality of housing openings, and wherein in the second position the first label size adaptor mask at least partially unblocks all of the plurality of housing openings.

15. The device according to claim 14, wherein another of the at least two slidable elements is a second label size adaptor mask, wherein in the first position the second label size adaptor mask completely blocks some, but not all, of the plurality of housing openings, wherein the plurality of housing openings that are not completely blocked by the second label size adaptor mask in the first position are not the same as the plurality of housing openings that are not completely blocked by the first label adaptor mask in the first position, wherein in the second position the second label size adaptor mask at least partially unblocks all of the plurality of housing openings, and wherein when both the first label size adaptor mask and the second label size adaptor mask are in the second position all of the plurality of housing openings are at least partially unblocked.

16. The device according to claim 15, wherein when the first label size adaptor mask and the second label size adaptor mask are both in the first position a smaller number of the plurality of housing openings are unblocked than when only of the first label size adaptor mask and the second label size adaptor mask is in the first position.

17. The device according to claim 9, wherein at least one of the at least two slidable elements is a first label size adaptor mask, wherein in the first position the first label size adaptor mask completely blocks some, but not all, of the plurality of housing openings, and wherein in the second position the first label size adaptor mask at least partially unblocks all of the plurality of housing openings, and wherein the first label size adaptor mask contacts the stationary perforated plate in a sealing manner on a side of the stationary perforated plate facing away from the feed device.

18. The device according to claim 17, wherein another of the at least two slidable elements is a second label size adaptor mask, wherein in the first position the second label size adaptor mask completely blocks some, but not all, of the plurality of housing openings, wherein the plurality of housing openings that are not completely blocked by the second label size adaptor mask in the first position are not the same as the plurality of housing openings that are not completely blocked by the first label adaptor mask in the first position, wherein at least one of the first label size adaptor mask and the second label size adaptor mask contacts the stationary perforated plate in a sealing manner.

19. The device according to claim 15, wherein the first label size adaptor mask contacts the second label size adaptor mask in a sealing manner.

20. The device according to claim 15, wherein the device further comprises a product data store for providing product-specific information and a label data store for providing label-specific information.

21. A method for labelling individual products comprising:
- transporting individual products to be labeled along a transport path using a feed device of a device for labelling products according to claim 1;
- dispensing a label from the label dispensing device into a blow-off position between the blowing head and the feed device as the product is being transported on the transport path past the blowing head of the application device;
- building up an overpressure in the pressure chamber of the blowing head; and
- transferring the label from the blow-off position onto the product by means of a compressed air pulse directed in the blow-off direction;
- wherein the compressed air pulse escapes from the pressure chamber through holes provided in the at least two slidable elements and through the plurality of housing openings in the housing part facing toward the feed device.

22. The method according to claim 21, wherein at least one of the at least two slidable elements forms a closure slide, which in the first position blocks all of the plurality of housing openings completely, and in the second position at least partially unblocks at least some of the housing openings, and wherein the compressed air pulse is generated by sliding the closure slide from the first position while the overpressure is being built up into the second position.

23. The method according to claim 22, wherein before the closure slide is slidingly moved from the first position into the second position, at least one slidable element forming a label size adaptor mask is moved into a position in which the label size adaptor mask unblocks some of the plurality of housing openings at least partially and blocks other of the plurality of housing openings completely.

* * * * *